US010403656B2

(12) United States Patent
Leon-Salas

(10) Patent No.: US 10,403,656 B2
(45) Date of Patent: Sep. 3, 2019

(54) ENERGY HARVESTING CONFIGURABLE IMAGE SENSOR

(71) Applicant: Purdue Research Foundation, West Lafayette, IN (US)

(72) Inventor: Walter Daniel Leon-Salas, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/650,823

(22) Filed: Jul. 14, 2017

(65) Prior Publication Data

US 2018/0019273 A1    Jan. 18, 2018

Related U.S. Application Data

(60) Provisional application No. 62/362,273, filed on Jul. 14, 2016.

(51) Int. Cl.
| | | |
|---|---|---|
| *H01L 27/146* | (2006.01) | |
| *H01L 31/053* | (2014.01) | |
| *H01L 27/142* | (2014.01) | |
| *H01L 31/02* | (2006.01) | |

(52) U.S. Cl.
CPC ...... *H01L 27/14609* (2013.01); *H01L 27/142* (2013.01); *H01L 27/14643* (2013.01); *H01L 31/02021* (2013.01); *H01L 31/053* (2014.12)

(58) Field of Classification Search
CPC ......... H01L 27/14609; H01L 31/02021; H01L 31/053; H01L 27/142; H01L 27/14643
USPC ....................................................... 320/101
See application file for complete search history.

(56) References Cited

U.S. PATENT DOCUMENTS

| | | | | |
|---|---|---|---|---|
| 5,227,887 | A * | 7/1993 | Dohi et al. ........ | H01L 27/14643 348/305 |
| 7,405,763 | B2 * | 7/2008 | Wu ....................... | H02J 7/0052 348/222.1 |
| 8,436,288 | B2 * | 5/2013 | Augusto ........... | H01L 27/14609 250/208.1 |
| 8,629,386 | B2 * | 1/2014 | Bermak et al. .......... | G01J 1/02 250/208.1 |
| 9,159,751 | B2 * | 10/2015 | Lee et al. .......... | H01L 27/14605 |
| 9,407,845 | B1 * | 8/2016 | Solh ................... | H04N 5/23241 |
| 2016/0056717 | A1 * | 2/2016 | Ota et al. .............. | H02M 3/155 250/366 |

(Continued)

OTHER PUBLICATIONS

Kamra,"Output Power Maximization in Energy Harvesting Applications", 2014, Indian Institute of Technology, Disseration, one set.*

(Continued)

*Primary Examiner* — Sun J Lin
(74) *Attorney, Agent, or Firm* — Purdue Research Foundation

(57) ABSTRACT

An image sensor is provided, the image sensor comprising a plurality of photo-diode pixels arranged in a two-dimensional array, an energy harvesting output bus connected to the plurality of photo-diode pixels, an image sensing output bus connected to the plurality of photo-diode pixels, and a plurality of switching buses connected to the plurality of photo-diode pixels to direct output of a varying percentage of the pixels to either the energy harvesting output bus or the image sensing output bus.

4 Claims, 4 Drawing Sheets

(56) References Cited

U.S. PATENT DOCUMENTS

2017/0141155 A1* 5/2017 Hughes et al. ......... H01L 22/14

OTHER PUBLICATIONS

Fish, A., "CMOS image sensors with self-powered generation capability," IEEE Trans. on Circuits and Systems-II, vol. 53, No. 11, pp. 1210-1214, 2006.
Shi, C., "A novel asynchronous pixel for an energy harvesting CMOS image sensor," IEEE Trans. on VLSI Systems, vol. 19, No. 1, pp. 118-129, 2011.
Law, M., "A low-power energy-harvesting logarithmic CMOS image sensor with reconfigurable resolution using two-level quantization scheme," IEEE Trans. on Circuits and Systems-II, vol. 58, No. 2, pp. 80-84, 2011.
Ay, S., "A CMOS energy harvesting and imaging (EHI) active pixel sensor (APS) imager for retinal prosthesis," IEEE Trans. Biomedical Circuits and Systems, vol. 1, No. 6, pp. 535-545, 2011.
Wang, T., "An image sensor with joint sensing and energy harvesting functions," IEEE Sensor Journal, vol. 15, No. 2, pp. 902-916, 2015.
Pour, G. "Energy harvesting using substrate photodiodes," IEEE Trans. Circuits and Systems-II, vol. 61, No. 7, pp. 501-505, 2014.

* cited by examiner

ENERGY HARVESTING CONFIGURABLE IMAGE SENSOR

CROSS-REFERENCE TO RELATED APPLICATIONS

The present patent application is related to and claims the priority benefit of U.S. Provisional Patent Application Ser. No. 62/362,273, filed Jul. 14, 2016, the contents of which is hereby incorporated by reference in its entirety into the present disclosure.

STATEMENT REGARDING GOVERNMENT FUNDING

This invention was made with government support under ECCS-1055169 awarded by the National Science Foundation. The government has certain rights in the invention.

TECHNICAL FIELD

The present application relates to image sensor systems, and more specifically, to a configurable image sensor having energy harvesting capabilities.

BACKGROUND

Many image sensing applications require sensor nodes to operate in remote and isolated areas for long periods of time. In these scenarios, the sensor nodes might not have access to the electric grid to recharge their batteries. Moreover, due to their remote location, replacing the batteries of these sensors will be very costly and in some instances even prohibitive. In these cases harvesting energy from the sensor's environment is an appealing solution which could eliminate battery replacement and enable long term operation of the sensor.

Sources of ambient energy can be as diverse as solar, thermal, wind, vibrations and electro-magnetic fields. Solar is one of the most abundant sources of energy in the planet and is especially suitable in outdoor monitoring scenarios where power densities can reach up to 100 mW/cm$^2$. Prior art image sensing systems provide various methods for harvesting energy from imaging sensing pixels. However, these systems are bulky, expensive, and overly complex. Therefore, improvements are needed in the field.

SUMMARY

According to one aspect, the present disclosure provides an image sensor, comprising a plurality of photo-diode pixels arranged in a two-dimensional array, an energy harvesting output bus connected to the pixels, an image sensing output bus connected to the pixels, and a plurality of switching busses, the switching buses connected to the pixels to direct output of a varying percentage of the pixels to either the energy harvesting output bus or the sensing bus.

The image sensor may further comprise a DC-DC converter connected to the energy harvesting output bus. The image sensor may further comprise an energy storage device connected to receive the output of the energy harvesting output bus. The pixels may further comprise a reset switch, the reset switch driven by a reset signal from a computer controller, the reset switch connected to reset the pixel in an image sensing mode. The pixels may further comprise an energy harvesting switch, the energy harvesting switch driven by an energy harvesting enable signal from a computer controller, the energy harvesting switch connected to drive the pixel in an energy harvesting mode when the energy harvesting enable signal is logic high.

The pixels may further comprise a mode selection switch configured to drive the pixel in one of either the image sensing mode or the energy harvesting mode. The mode selection switch may further comprise a logic gate which receives a reset signal and one of the energy harvesting enable bus signals as input. The logic gate may comprise a NAND gate having two inputs, wherein a first input is inverted and is connected to the energy harvesting enable bus, and wherein a second input is connected to the reset signal. The reset switch may be configured to connect a cathode of the photodiode to a supply voltage when output of the logic gate is logic low.

The image sensor may further comprise a plurality of amplifiers connected between the photodiode pixels and the image sensing bus, wherein the output of the image sensing pixel is connected to an input of the amplifier, and an output of the amplifier is connected to the image sensing bus. The image sensor may further comprise a row enable switch connected between the output of the amplifier and the image sensing bus.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1:
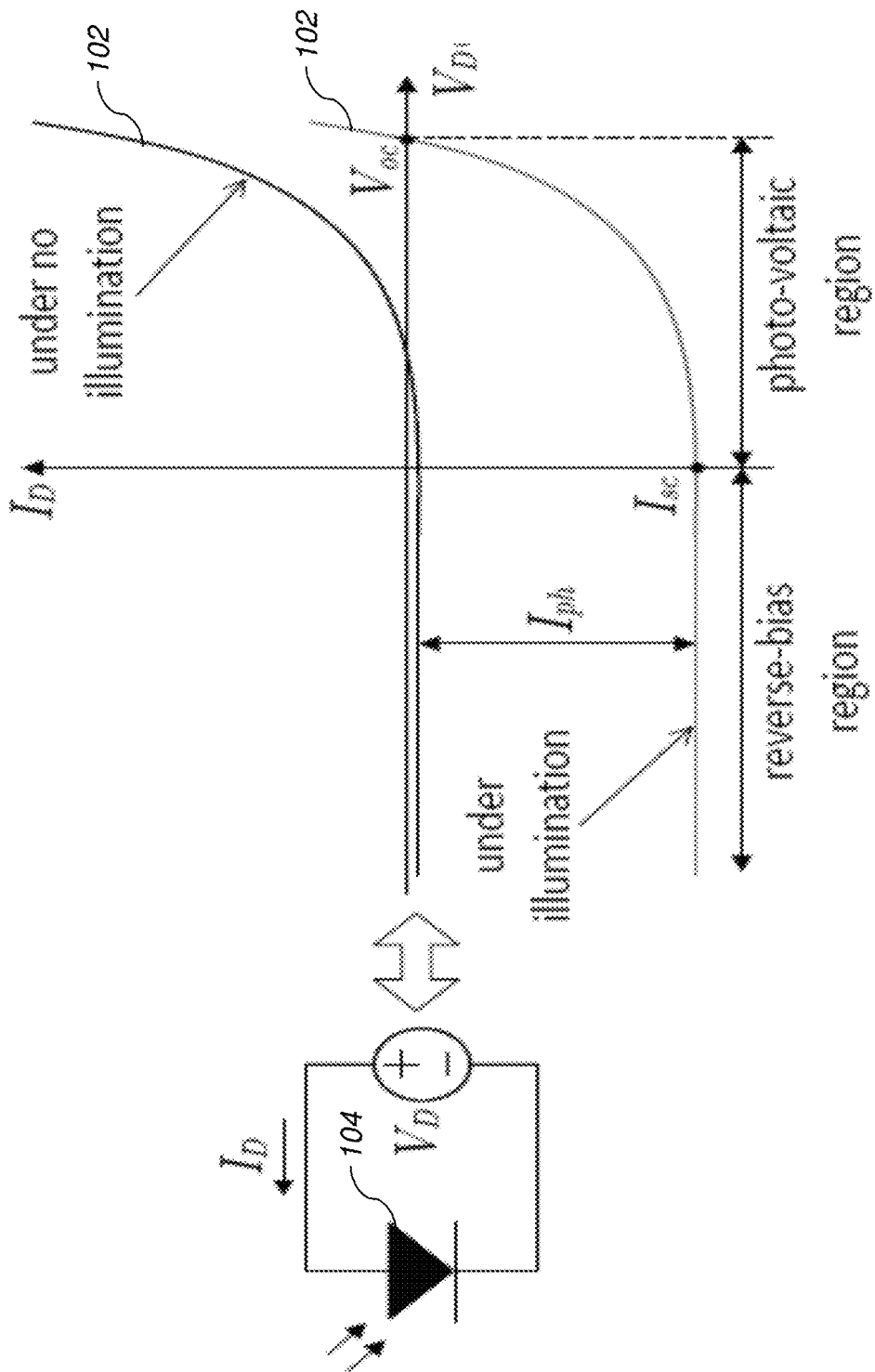
FIG. 1 shows regions of operation of a photodiode under illumination and non-illumination conditions according to on embodiment.

FIG. 1 shows the current-vs-voltage (I-V) curve 102 of a typical photodiode 104 under illumination and no-illumination conditions. Under illumination the I-V curve 102 moves down by an amount equal to the photo-generated current or $I_{ph}$. As can be appreciated from the figure, two very distinctive operating regions appear when the photodiode is illuminated: the reverse-bias region and the photo-voltaic region. In the reverse-bias region, the potential across the photodiode, $V_D$, is negative and the photodiode current, $I_D$, flows out of the diode's anode. Hence, the photodiode dissipates energy. In the photo-voltaic region, on the other hand, $V_D$ is positive while $I_D$ flows out of the diode's anode. Hence, the photodiode generates energy. The configurable pixel architecture exploits these two regions: it operates the photodiode in the reverse-bias region when the pixel is configured as a photo-sensor (this is the standard operating mode in CMOS image sensors). When the pixel is configured as an energy harvester, it operates the photodiode in the photo-voltaic region.

An active pixel sensor (APS) image sensor operates as follows. The in-pixel photodiode is reversed biased by connecting its anode to ground and its cathode to a positive reset voltage ($V_{rst}$) via a reset switch. Closing the reset switch charges the photodiode's depletion capacitance (CD) to $V_{rst}$. When the reset switch opens, the photo-generated current ($I_{ph}$) discharges CD for a fixed amount of time known as the integration time ($T_{int}$). To work in the photo-voltaic region, the photodiode's cathode is connected to ground while the photodiode's anode is connected to a DC-DC converter.

Figure 2:
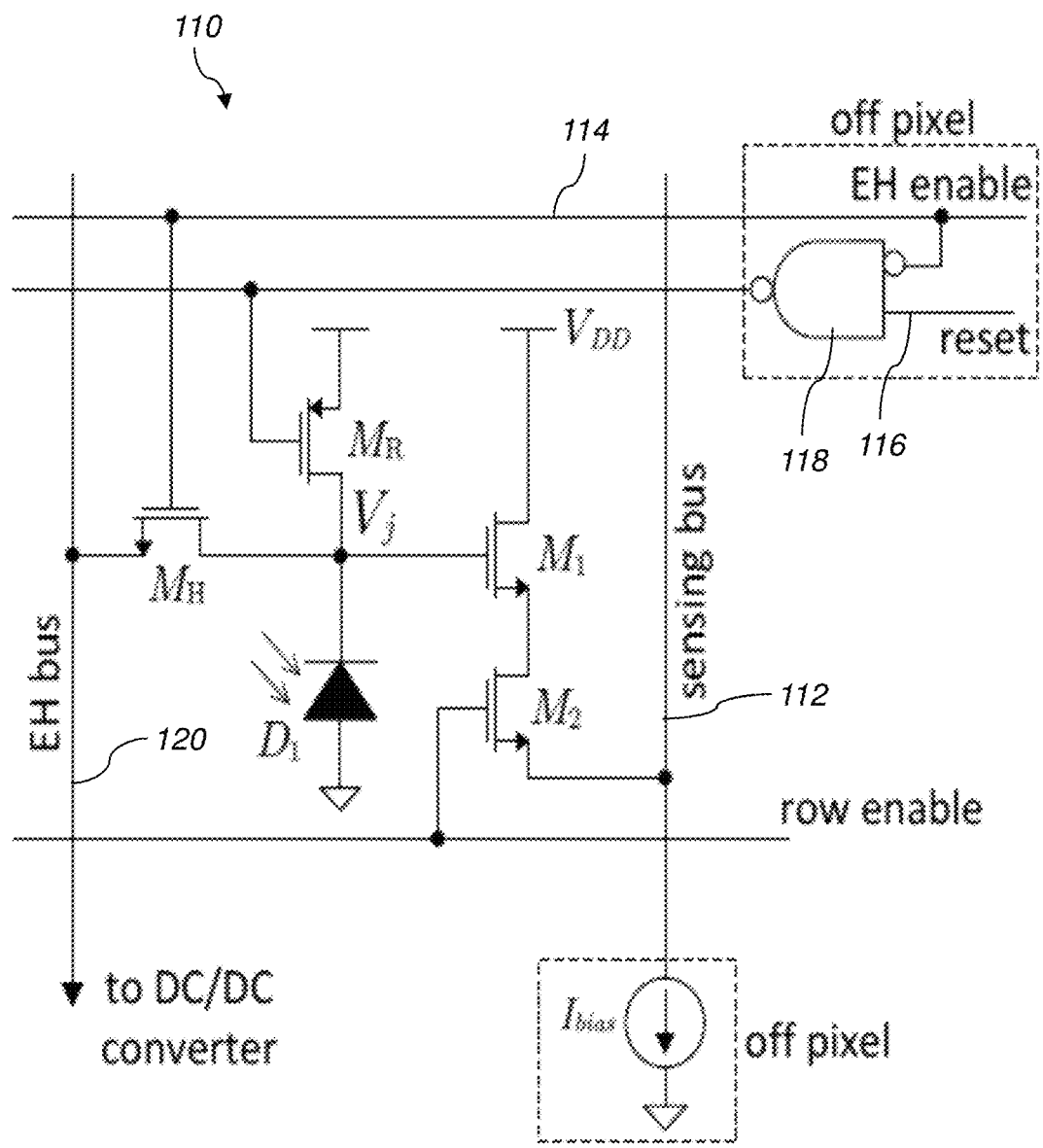
FIG. 2 shows a schematic of a configurable energy harvesting pixel according to one embodiment.

FIG. 2 shows a schematic diagram of a configurable energy harvesting pixel 110 according to one embodiment. It comprises three NMOS transistors ($M_1$, $M_2$ and $M_H$), a PMOS transistor ($M_R$) and a N-well/P-sub photodiode ($D_1$) connected as shown. Transistor $M_R$ implements the reset switch.

In the sensing mode, transistor $M_H$ is off and the pixel works as a standard APS pixel. In the APS architecture, transistor $M_1$ and the off-pixel current sink form a source follower amplifier. Transistor $M_2$ works as a switch. When $M_2$ is on, the source follower drives a sensing bus 112 with a voltage proportional to $V_j$, where $V_j$ is the voltage generated by the photodiode $D_1$ when acting as an image sensor. The sensing bus 112 is shared with other pixels on the same column of a sensor (discussed below). Only one pixel, however, drives the sensing bus 112 at any time. To configure a pixel in the sensing mode, an energy harvesting enabling signal 114 ("EH enable") is set to a logic low level as shown, thereby preventing energy harvesting from the photodiode $D_1$. The reset transistor $M_R$ is turned on to reset the photodiode $D_1$ (by connected the cathode of the photodiode to $V_{DD}$) at the end of a sensing cycle by setting the reset bus 116 to logic high.

To configure the pixel 110 in the energy harvesting mode, the energy harvesting enable signal 114 is set to a logic high level. The off-pixel NAND gate 118 is employed to avoid turning on transistor $M_R$, and thus resetting the photodiode $D_1$, when the pixel is working in the energy harvesting mode. Note that $M_R$ is illustrated here as an NMOS transistor, which turns on when it's input is logic low, and turns off when it's input is logic high. In other embodiments, equivalent logic gate arrangements may be used instead of a NAND gate to avoid turning on transistor $M_R$, and thus resetting the photodiode, when the pixel is working in the energy harvesting mode. For example, an OR gate may be used in place of the NAND, with its "reset" input being inverted. When "EH enable" is logic high, transistor $M_H$ turns on and connects the cathode terminal of the photodiode $D_1$ to the energy harvesting bus 120 ("EH bus"). During this operation, the output of the NAND gate 118 is held high, and the $M_R$ transistor is therefore turned off. The EH bus 120 is a global bus that connects the photodiodes of the pixels configured in energy harvesting mode to a switched-inductor DC-DC converter.

Figure 3:
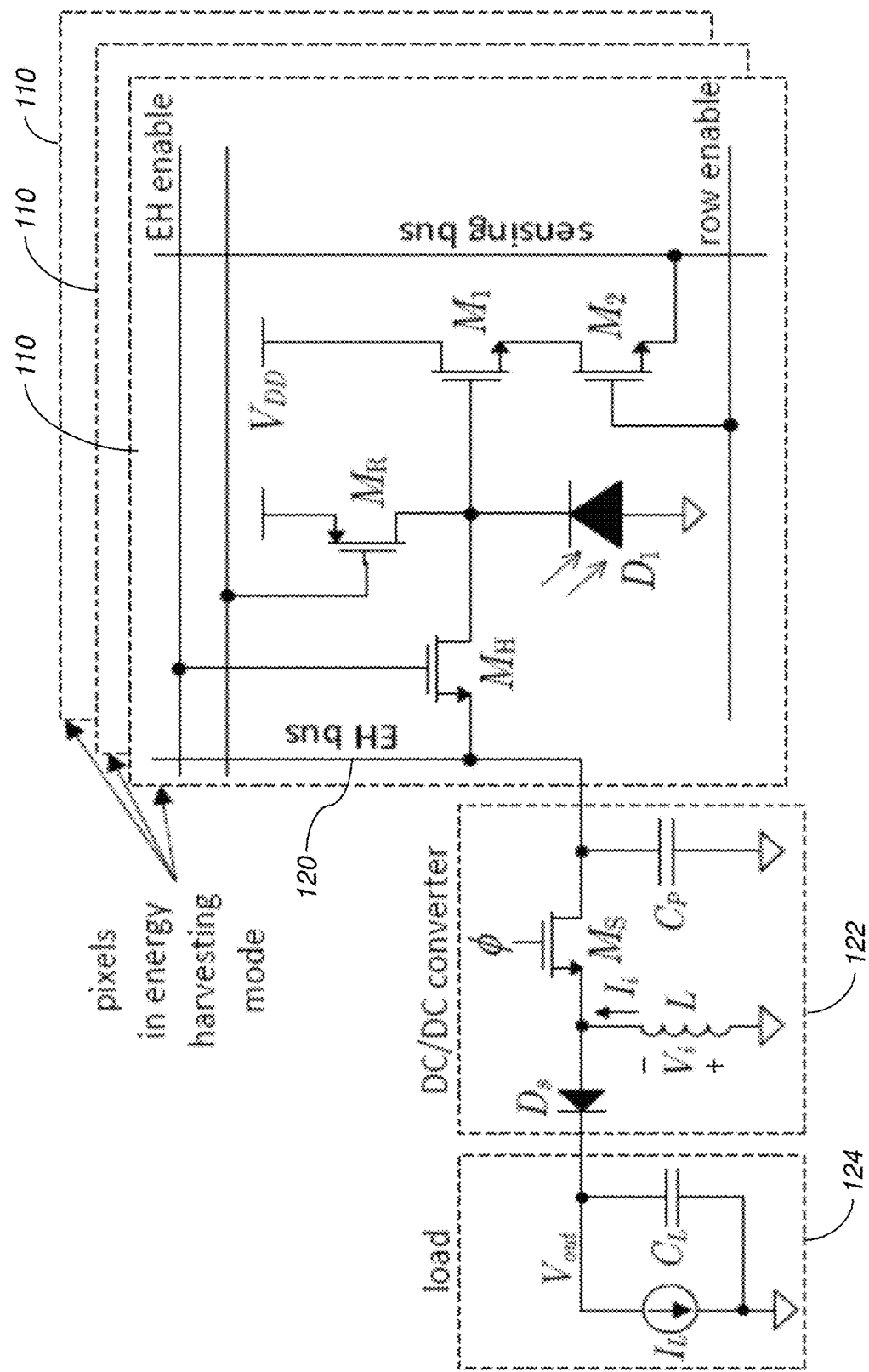
FIG. 3 shows a schematic of a connection between the configurable energy harvesting pixel of FIG. 2 and a DC-DC converter according to one embodiment.

FIG. 3 shows the connection between the pixels configured in energy harvesting mode and the DC-DC converter 122 to supply load 124. The DC-DC converter comprises a NMOS transistor $M_S$, an inductor L, a capacitor $C_P$ and the Schottky diode $D_S$ connected as shown. When the clock signal φ is logic high, the inductor L gets charged by the photo-generated currents from the in-pixel photodiodes $D_1$. When φ is logic low the inductor L discharges into the load.

Figure 4:
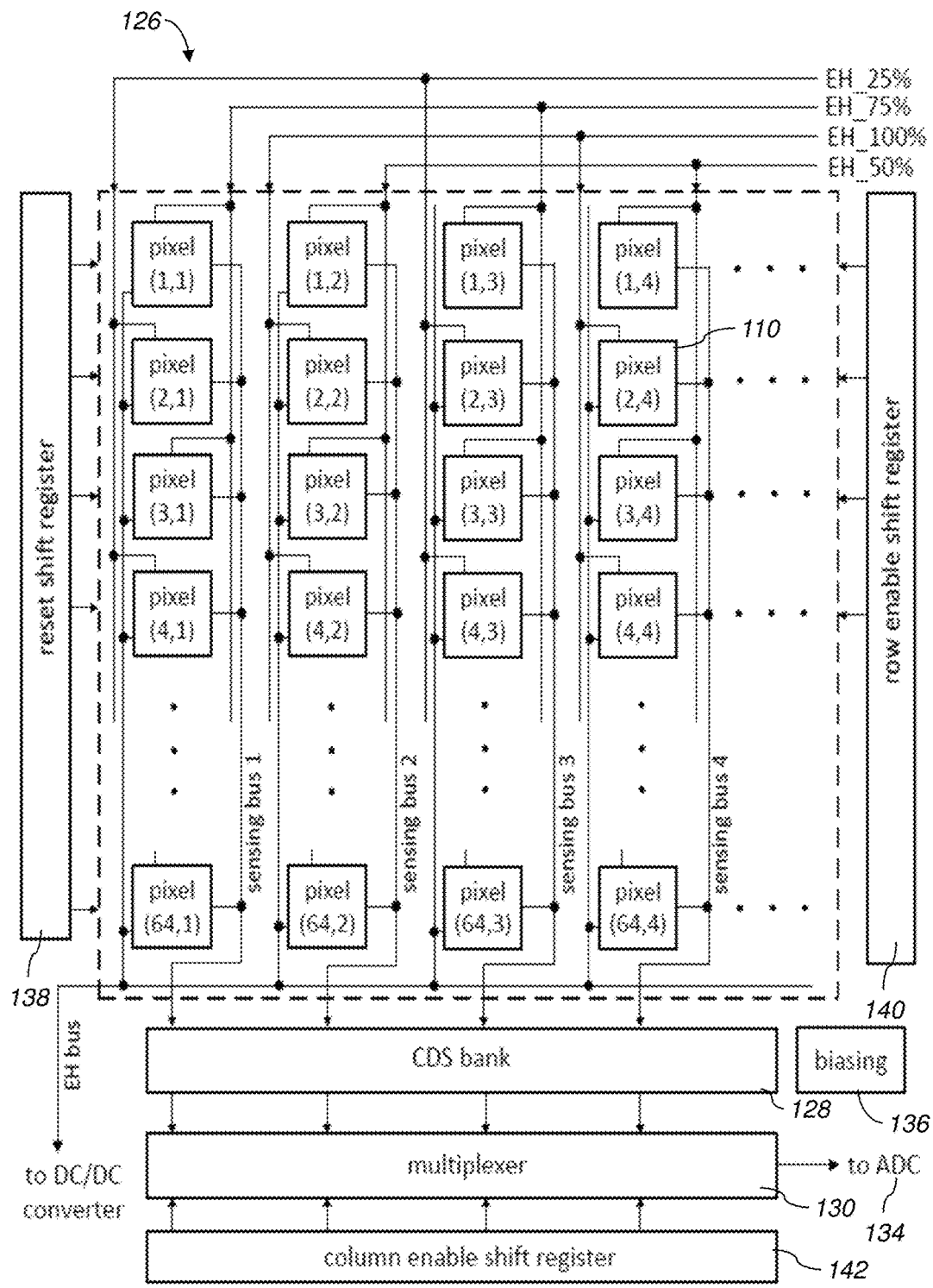
FIG. 4 shows a schematic of an image sensor having a plurality of configurable energy harvesting pixels according to one embodiment.

FIG. 4 shows a configurable energy harvesting image sensor 126 according to one embodiment. The image sensor 126 implements a plurality of the pixels 110 of FIG. 2 in a grid pattern as shown. In the illustrated embodiment, the image sensor 126 includes a 64×64 array of pixels 110, although other array sizes may also be used. The image sensor 126 may also include a bank of correlated double sampling (CDS) units 128 (shown here as a bank of 64 units), a multiplexer 130 (in the illustrated example, a 64-to-1 analog multiplexer), a cyclic analog-to-digital converter (ADC) 134, and a voltage bias-generator circuit 136 connected as shown. Two vertical shift registers (reset shift register 138 and row enable shift register 140) may also be included to generate reset and row enable signals for the pixels 110. A horizontal column enable shift register 142 may also be included to generate the column enable signals.

In operation, the image sensor 126 is read out in a raster scan fashion. The reset shift register 138 is used to sequentially reset each row of the array of pixels 110. The row enable shift register 138 enables the pixels 110 in a row $T_{int}$ seconds after the pixels 110 were reset. When a pixel 110 is enabled, it outputs (on the sensing bus 112) a voltage, $V_{ph}$, that is a function of the photo-generated current $I_{ph}$ and $T_{int}$.

The image sensor 126 allows the percentage of sensor pixels 110 operating in energy harvesting mode to be varied in order to respond to environmental conditions, image resolution requirement or bandwidth constraints. For instance, if the sensor's battery charge is low, more pixels 110 can be configured to harvest energy. As more pixels are configured as energy harvesters, less pixels 110 will be available for image acquisition and the image resolution will decrease. However, the missing pixel values can be estimated from the available pixels. Moreover, since fewer pixel values need to be read from the sensor, the read-out bandwidth decreases.

The percentage of pixels configured in energy harvesting mode can be varied in discrete steps (e.g., 0%, 25%, 50%, 75% and 100%) using the signals "EH 25%", "EH 50%", "EH 75%", and "EH 100%" shown in FIG. 4 and which are tied to the "EH enable" bus 114 of each pixel 110. This process can be explained with the 16-pixel block spanning from pixel(1,1) to pixel(4,4) shown in FIG. 4. The connectivity pattern in this 16-pixel block is repeated throughout the array. When "EH 25%" is logic high while "EH 50%", "EH 75%" and "EH 100%" are logic low, 25% of pixels, that is pixel(2,1), pixel(4,1), pixel(2,3) and pixel(4,3), are configured in energy harvesting mode. To configure 50% of the pixels in energy harvesting mode, both "EH 25%" and "EH 50%" are set to logic high, while "EH 75%" and "EH 100%" are set to logic low. Similarly, to configure 75% of the pixels in energy harvesting mode, "EH 25%", "EH 50%" and "EH 75%" are set to logic high and "EH 100%" is set to logic low. When "EH 25%", "EH 50%", "EH 75%" and "EH 100%" are set to logic high, 100% of the pixels are configured in energy harvesting mode. Note that an evenly distributed pattern of energy harvesting pixels may be used when less than 100% of the pixels 110 are being run in energy harvesting mode. For example, when 50% of the pixels are in energy harvesting mode, the pixels being used to harvest energy are (2,1), (4,1), (2,3), (4,3), (1,2), (1,4), (3,2), and (3,4). Each CDS unit in the CDS bank 128 may comprise a switched-capacitor circuit that outputs a voltage proportional to the difference Vrst−Vph, where Vrst is the output of the pixel during reset. By subtracting Vph from Vrst, the offset component of the fixed pattern noise is canceled out.

It shall be understood that the described image sensor may be implemented and controlled using various peripheral computer components, including computer microprocessors and digital electronic memory, in order to control the various signals required to operate the pixel sensing and energy harvesting functions described herein.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

Furthermore, various aspects herein may be embodied as computer program products including computer readable program code stored on a tangible non-transitory computer readable medium or memory communicatively connected to a computer processor or microcontroller. Such a medium can be manufactured as is conventional for such articles, e.g., by pressing a CD-ROM. The program code includes computer program instructions that can be loaded into the processor, to cause functions, acts, or operational steps of various aspects herein to be performed by the processor. Computer program code for carrying out operations for various aspects described herein may be written in any combination of one or more programming language(s), and can be loaded from the memory for execution.

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. An image sensor, comprising:
    a plurality of photo-diode pixels arranged in a two-dimensional array;
    an energy harvesting output bus connected to the pixels;
    an image sensing output bus connected to the pixels;
    a plurality of switching busses, the switching buses connected to the plurality of photo-diode pixels to direct output of a varying percentage of the plurality of photo-diode pixels to an output of the energy harvesting output bus; and
    a plurality of amplifiers connected between photo-diode pixels of the plurality of photo-diode pixels and the image sensing bus, wherein an output of the an image sensing photo-diode pixel is connected to an input of an amplifier of the plurality of amplifiers, and an output of the amplifier is connected to the image sensing output bus.

2. The image sensor of claim 1, further comprising a row enable switch connected between the output of the amplifier and the image sensing bus.

3. An image sensor, comprising:
    a plurality of photo-diode pixels arranged in a two-dimensional array;
    an energy harvesting output bus connected to the pixels;
    an image sensing output bus connected to the pixels; and
    a plurality of switching busses, the switching buses connected to the plurality of photo-diode pixels to direct output of a varying percentage of the plurality of photo-diode pixels to an output of the energy harvesting output bus;
    wherein a first switching bus of the plurality of switching buses is configured to direct output of a first subset of the plurality of photo-diode pixels to the energy harvesting output bus.

4. The image sensor of claim 3 wherein a second switching bus of the plurality of switching buses is configured to direct output of a second subset of the plurality of photo-diode pixels to the energy harvesting output bus.

\* \* \* \* \*